United States Patent
Goergen

(10) Patent No.: US 7,405,947 B1
(45) Date of Patent: Jul. 29, 2008

(54) BACKPLANE WITH POWER PLANE HAVING A DIGITAL GROUND STRUCTURE IN SIGNAL REGIONS

(75) Inventor: Joel R. Goergen, Maple Grove, MN (US)

(73) Assignee: Force 10 Networks, Inc., San Jose, CA (US)

( * ) Notice: Subject to any disclaimer, the term of this patent is extended or adjusted under 35 U.S.C. 154(b) by 0 days.

(21) Appl. No.: 11/809,595

(22) Filed: Jun. 1, 2007

Related U.S. Application Data

(62) Division of application No. 11/009,408, filed on Dec. 8, 2004, now Pat. No. 7,239,527.

(51) Int. Cl.
*H01R 12/16* (2006.01)
(52) U.S. Cl. ........................ 361/788; 174/255
(58) Field of Classification Search ................ 361/788, 361/780, 794, 777; 174/261, 262
See application file for complete search history.

(56) References Cited

U.S. PATENT DOCUMENTS

| | | | | |
|---|---|---|---|---|
| 4,942,400 A | * | 7/1990 | Tarzaiski et al. ............. 341/155 |
| 5,748,173 A | * | 5/1998 | Gur .............................. 345/629 |
| 6,229,095 B1 | * | 5/2001 | Kobayashi .................. 174/255 |
| 2006/0198113 A1 | * | 9/2006 | Lambert et al. ............. 361/783 |
| 2006/0232949 A1 | * | 10/2006 | Osaka ......................... 361/788 |

* cited by examiner

*Primary Examiner*—Dean A. Reichard
*Assistant Examiner*—Yuriy Semenenko
(74) *Attorney, Agent, or Firm*—James E Harris

(57) ABSTRACT

For electrical backplanes and the like, a power plane adaptation to improve the propagation of high-speed signals through clearances in an embedded power plane is disclosed. In exemplary embodiments, the power plane is segmented in a high-speed connector region, such that a portion of the metal layer that forms the power plane is retained in the high-speed connector region—but isolated from the power-delivery portion of the power plane. The isolated portion is connected to digital ground, and clearances are formed therein where high-speed signaling throughholes will pass through the region. In some embodiments, various attainable advantages include better manufacturability, better matching and control of high-speed signaling throughhole impedance, and improved noise isolation. Other embodiments are described and claimed.

9 Claims, 6 Drawing Sheets

BACKPLANE WITH POWER PLANE HAVING A DIGITAL GROUND STRUCTURE IN SIGNAL REGIONS

CROSS-REFERENCE TO RELATED APPLICATIONS

This application claims priority to and is a divisional of co-owned, co-pending U.S. patent application Ser. No. 11/009,408, filed Dec. 8, 2004, by Joel R. Goergen, entitled BACKPLANE WITH POWER PLANE HAVING A DIGITAL GROUND STRUCTURE IN SIGNAL REGIONS, which is incorporated herein by reference in its entirety.

FIELD OF THE INVENTION

This invention relates generally to backplanes, and more specifically to backplane wiring systems including relatively high voltage power distribution planes and high-speed signal traces that pass through the power distribution planes.

BACKGROUND OF THE INVENTION

A backplane generally comprises a printed circuit board having a number of card connection slots or bays. Each slot or bay comprises, e.g., one or more modular signal connectors or card edge connectors, mounted on the backplane. A removable circuit board or "card" can be plugged into the connector(s) of each slot. Each removable circuit board contains drivers and receivers necessary to communicate signals across the backplane with corresponding drivers and receivers on other removable circuit boards.

One or more layers of conductive traces are formed on and/or in the backplane. The traces connect to individual signal connection points at the various slots to form data lines and control lines. Further details of the design and construction for a complex high performance router backplane are described in U.S. Pat. No. 6,822,876, issued Nov. 23, 2004, to the inventor of the present application and incorporated herein by reference.

One embodiment described in the '876 patent is reproduced in FIG. 1. A top panel region of backplane 100 has connector regions ("slots") for sixteen cards. The outboard seven slots on each end are each configured to accept a line card (slots LC0 to LC6 and LC7 to LC13). The middlemost two slots are each configured to accept a route-processing module (slots RPM0 and RPM1). Each slot has three upper connector regions (e.g., regions JL4U0, JL4U1, and JL4U2 for slot LC4) used to distribute power and ground signals to a card. Below these, each line card slot has three high-speed connector regions (e.g., regions JLC4A, JLC4B, and JLC4C for slot LC4). The RPM slots serve more card connections than the line card slots, and therefore use a larger high-speed connector region. In one embodiment, the high-speed connector regions are laid out to accept HS3 press-fit sockets, available from Tyco Electronics Corporation (formerly AMP Incorporated).

A bottom panel region of backplane 100 contains connector regions or slots for nine cards. Each of these slots in configured to accept a switch fabric card (slots SF0 to SF8). Each slot has two lower connector regions (e.g., regions JSF8U0 and JSF8U1 for slot LC8) used to distribute power and ground signals to a switch fabric card. Above these, each switch fabric card slot has three high-speed connector regions (e.g., regions JSF8A, JSF8B, and JSF8C for slot SF8).

The bottom panel region also contains connector regions for connecting power and ground to the backplane. Four 48-volt power distribution layers are embedded in backplane 100, two for "A" power distribution and two for "B" power distribution layer. At the lower left of backplane 100, two large multi-thru-hole regions 48 VA and 48 VA RTN allow for connection of "A" power supply and return leads to one power supply, and a third large region CGND allows for connection of a common ground. Similar connections for a "B" power distribution layer to a second power supply exist at the lower right of backplane 100. The "A" and "B" power distribution systems provide redundancy for the router.

The power distribution scheme used for the backplane of FIG. 1 employs four relatively thick conductive planes near the center of the backplane for power distribution to the line and switch fabric cards. These planes provide a relatively noise-free and economic power distribution scheme for a router, as compared to more conventional power distribution approaches such as bus bars or separate power distribution circuit boards. These backplanes are believed to be the first high-speed backplanes capable of distributing 100 amperes or more of current to attached components (in this specific embodiment, two distinct power distribution planes are each capable of distributing 200 amperes of current from separate 48-volt supplies). From the 48 VA, 48 VA RTN, 48 VB, and 48 VB RTN power supply connection points shown in FIG. 1, power is fanned out to thru-holes for the switch fabric power connectors (e.g., JSF8U0 and JSF8U1) arranged along the bottom of the backplane and thru-holes for the line and RPM card power connectors (e.g., JL4U0, JL4U1, and JL4U2) arranged along the top of the backplane. This arrangement is preferred, in part, because it leaves more trace routing room near the center of the backplane for creating shorter high-speed traces. The power plane metal is removed in the high-speed connector regions, but generally covers the remainder of the backplane plan view to provide a high-current, low-resistance power path.

FIG. 2 contains a magnified view of the high-speed connector region JLC4A shown in FIG. 1, for the power plane layers L16 to L19 of backplane 100 (the layer arrangement of backplane 100 will be described further in conjunction with FIGS. 3 and 4 below). Signal throughholes are arranged in ten rows of six throughholes each, with one signal throughhole 320 identified on row eight and another signal throughhole 420 identified on row ten. A row of three digital ground throughholes is arranged between each two rows of signaling throughholes—one digital ground throughhole 310 is identified between signal rows six and seven, and another digital ground throughhole 410 is identified between signal rows nine and ten.

A minimum power clearance $C_P$ must be maintained in the backplane design, between each signal or digital ground throughhole and the power plane 210, which carries 48-volt primary power. This power clearance, including the area around the throughholes, is filled with dielectric resin 220 during the board fabrication process.

FIG. 3 illustrates the full cross-section of the material stack for backplane 100, taken through throughholes 310 and 320 as indicated in FIG. 2. The material stack of FIG. 3 has 34 conductive layers L01 to L34 and appropriate insulating layers therebetween. For each conductive layer, FIG. 3 indicates the primary purpose of that layer. Layers labeled "GND" are digital ground plane layers. Layers labeled "HSn" are the high-speed signaling layers, where n represents the layer number. These layers provide high-speed differential traces connecting various card slots. Layers labeled "Signal xn" and "Signal yn" are low-speed signaling layers, which provide other signal connections between various card slots. The two "A 48V" layers are the supply ("dc") and return ("rtn") for one power supply, and the two "B 48V" layers are the supply and return for the other power supply. The dotted areas between the conductive layers represent dielectric layers.

Also notable in this material stack is that each high-speed layer (with its differential signaling traces) is formed approximately equally spaced from and between two digital ground planes, e.g., high-speed layer HS1 is formed on layer L03, between ground planes at L02 and L04. Similarly, low-speed signaling layers L13 and L14 are isolated from the remaining stack by two digital grounds (L12 and L15), low-speed signaling layers L21 and L22 are isolated by two digital grounds (L20 and L23), and the four power distribution layers L15 to L19 are isolated from the remaining stack by two digital grounds (L15 and L20) at the center of the material stack. Further, the two power supply planes are placed between the two power return planes to provide yet one more layer of isolation. The result is a material stack that efficiently manages electromagnetic interference (EMI) to provide clean power distribution and good isolation for the high-speed signals.

BRIEF DESCRIPTION OF THE DRAWING

The invention may be best understood by reading the disclosure with reference to the drawing, wherein.

DETAILED DESCRIPTION OF THE PREFERRED EMBODIMENTS

Several terms have been assigned particular meanings within the context of this disclosure. As used herein, high-speed signaling refers to signaling on a differential signal pair at a data rate greater than about 2.5 Gbps. A high-speed signaling layer or high-speed differential trace plane contains high-speed differential signal trace pairs, but may also contain lower speed and/or single-ended traces. An electrical backplane is a circuit board that contains plane layers in the disclosed embodiments, and electrically conductive trace layers capable of routing signals between various integrated circuits and/or circuit cards removably and/or permanently attached to the backplane. Midplanes and motherboards that provide power distribution planes can also generally fit within this intended definition of an electrical backplane.

Figure 1:
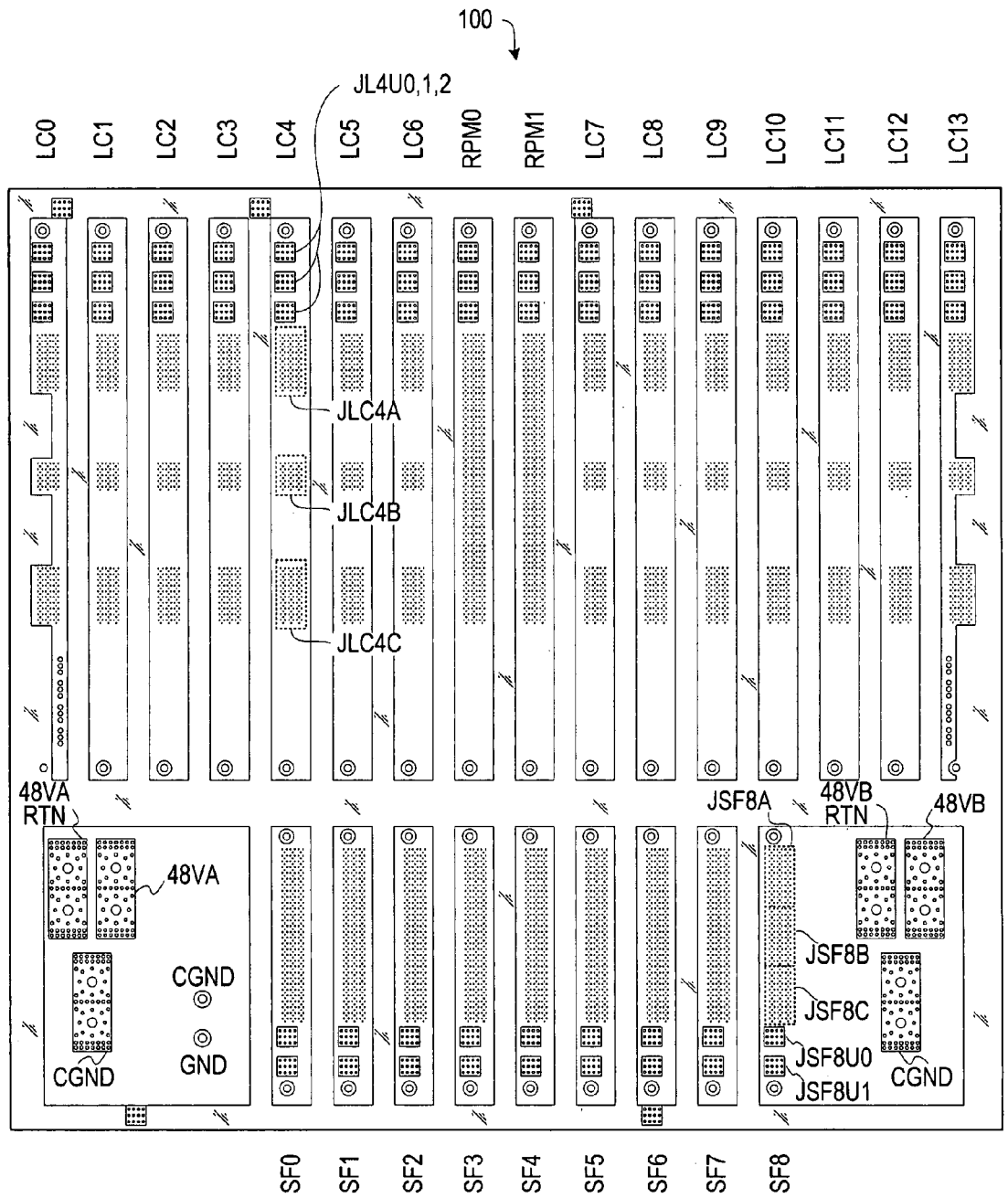
FIG. 1 shows the external layout for a router backplane circuit board.
Figure 2:
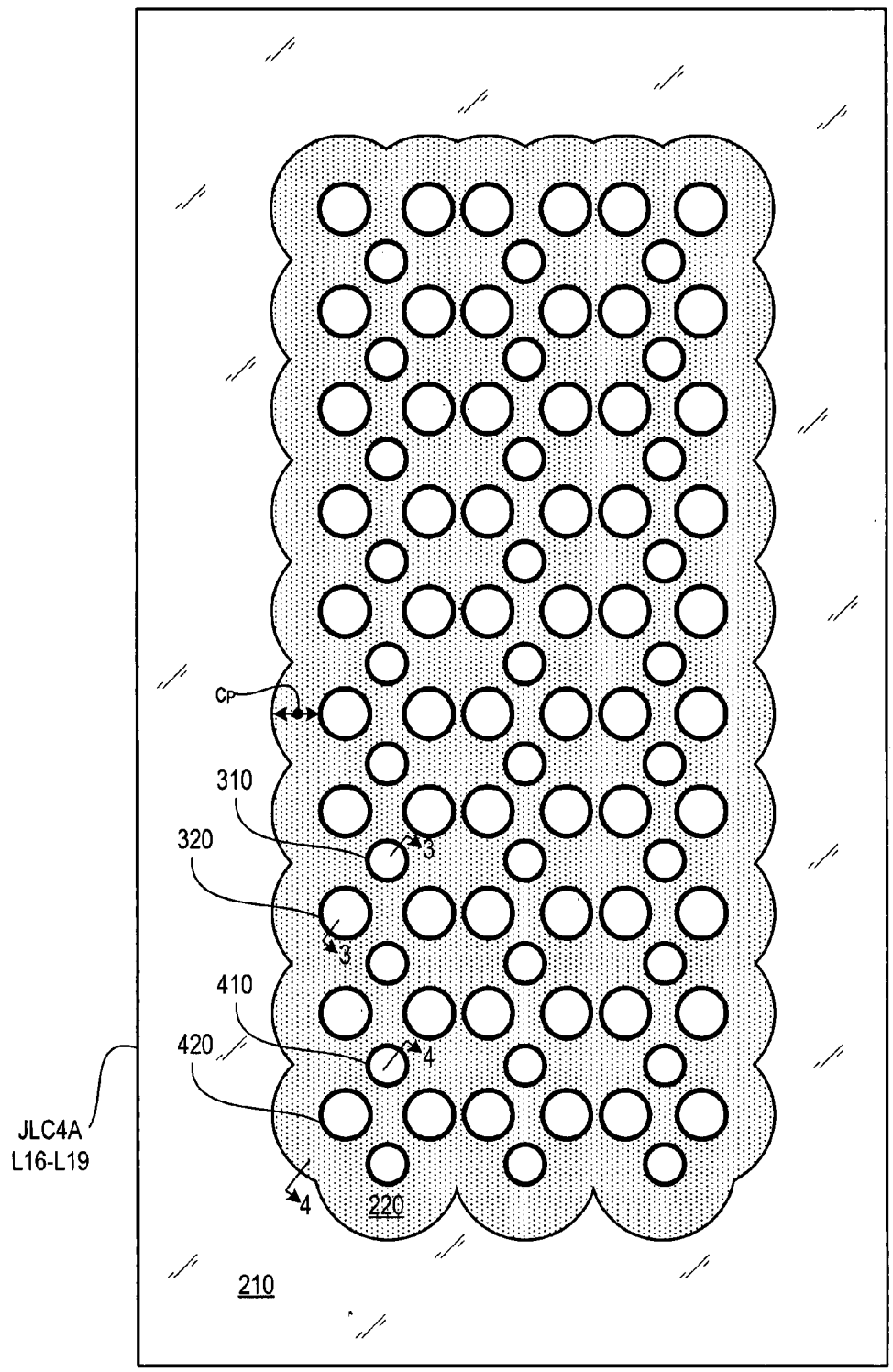
FIG. 2 depicts internal details for a high-speed connector region of the backplane circuit board of FIG. 1, for an embedded power distribution plane.

Referring back to FIGS. 2 and 3, several previously unappreciated difficulties with the design have been discovered. One such difficulty arises from the large clearance $C_P$ that must be maintained between signal and digital ground throughholes and the 48 V power layers. Because of the relatively close proximity of the throughholes in a high-speed connector region, the clearance $C_P$ around each throughhole overlaps the clearance of its neighboring throughholes, precluding any of the power plane from protruding into the high-speed connector region.

Figure 3:
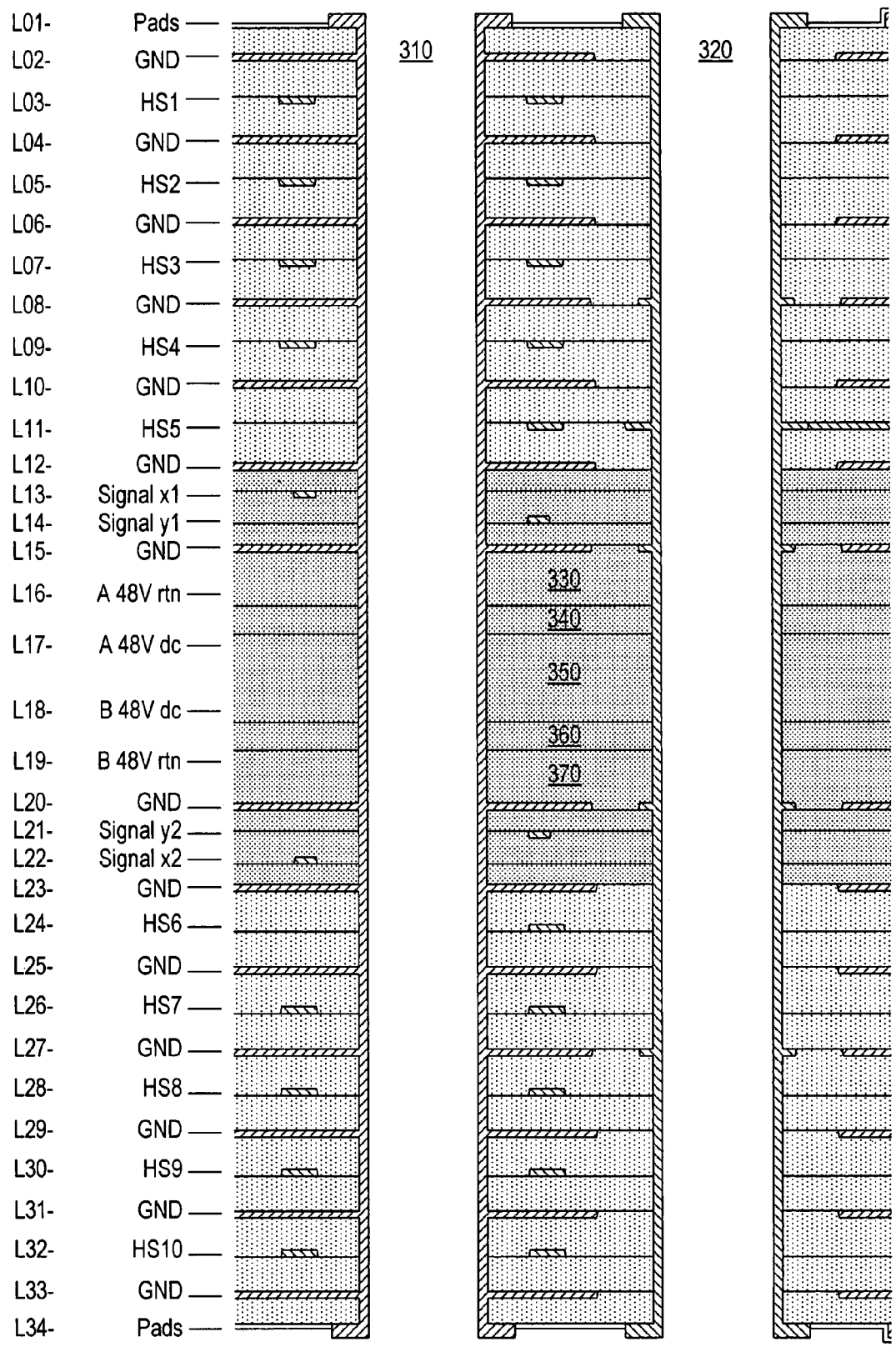
FIG. 3 illustrates a cross section of the backplane circuit board of FIG. 1, taken through a high-speed throughhole and an adjacent digital ground throughhole.

At the time that the layers of the backplane are booked, the throughholes do not yet exist. Accordingly, clearance 220 forms one large area where the power plane metal 210 is removed prior to booking. FIG. 3 shows how the clearance region appears in cross-section. Dielectric layers 340 and 360 are core layers upon which the four power plane layers are formed. Since the power plane layers are etched away in this region, resin from b-stage dielectric layers 330, 350, and 370 must fill the remaining space in each high-speed connector region. This space is significant, since the etched-away power plane metal is preferably 3-ounce or 4-ounce copper, with a thickness rivaling that of the b-stage dielectric that must expand to fill the space. Referring to the partial cross-section of FIG. 4, which shows the closest approach of the power plane layers 210, 440, 450, and 460 to signal throughhole 420, the significant amount of resin required to fill the clearance can be appreciated.

Figure 4:
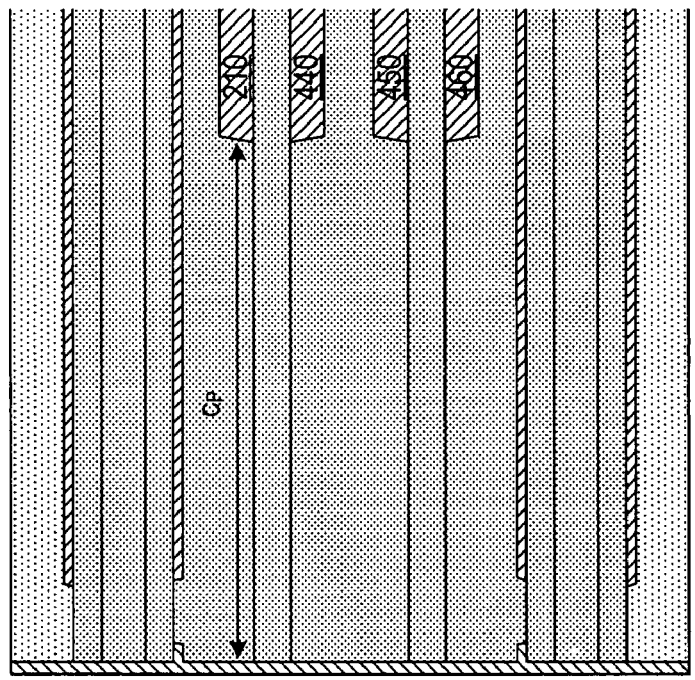
FIG. 4 illustrates the central section of the cross-section of FIG. 3, expanded laterally to show power plane details.
Figure 4:
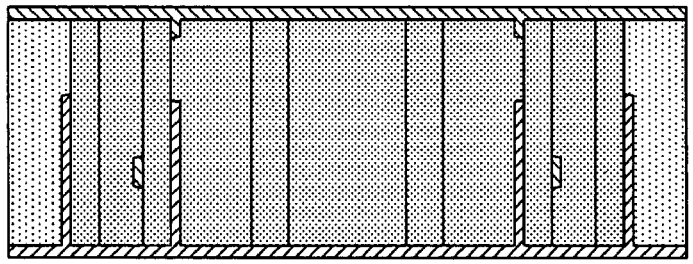
Figure 4:
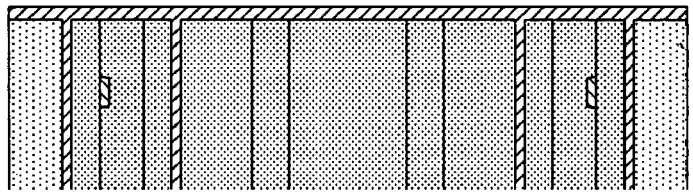

FIGS. 3 and 4 show another problem with this arrangement. In FIG. 3, the throughhole impedance is controlled in large part by coupling with the digital ground planes (GND). No comparable coupling is available, however, at layers L16-L19 due to the large power clearance required. These layers occupy a significant portion of the overall backplane cross-section, and thus a significant portion of the throughhole experiences a different impedance than the rest of the throughhole. The result is signal loss at high frequency.

An additional problem is that although the clearance $C_P$ is large, noise coupling between the power planes 210, 440, 450, and 460 and throughhole 420 can still occur.

Figure 5:
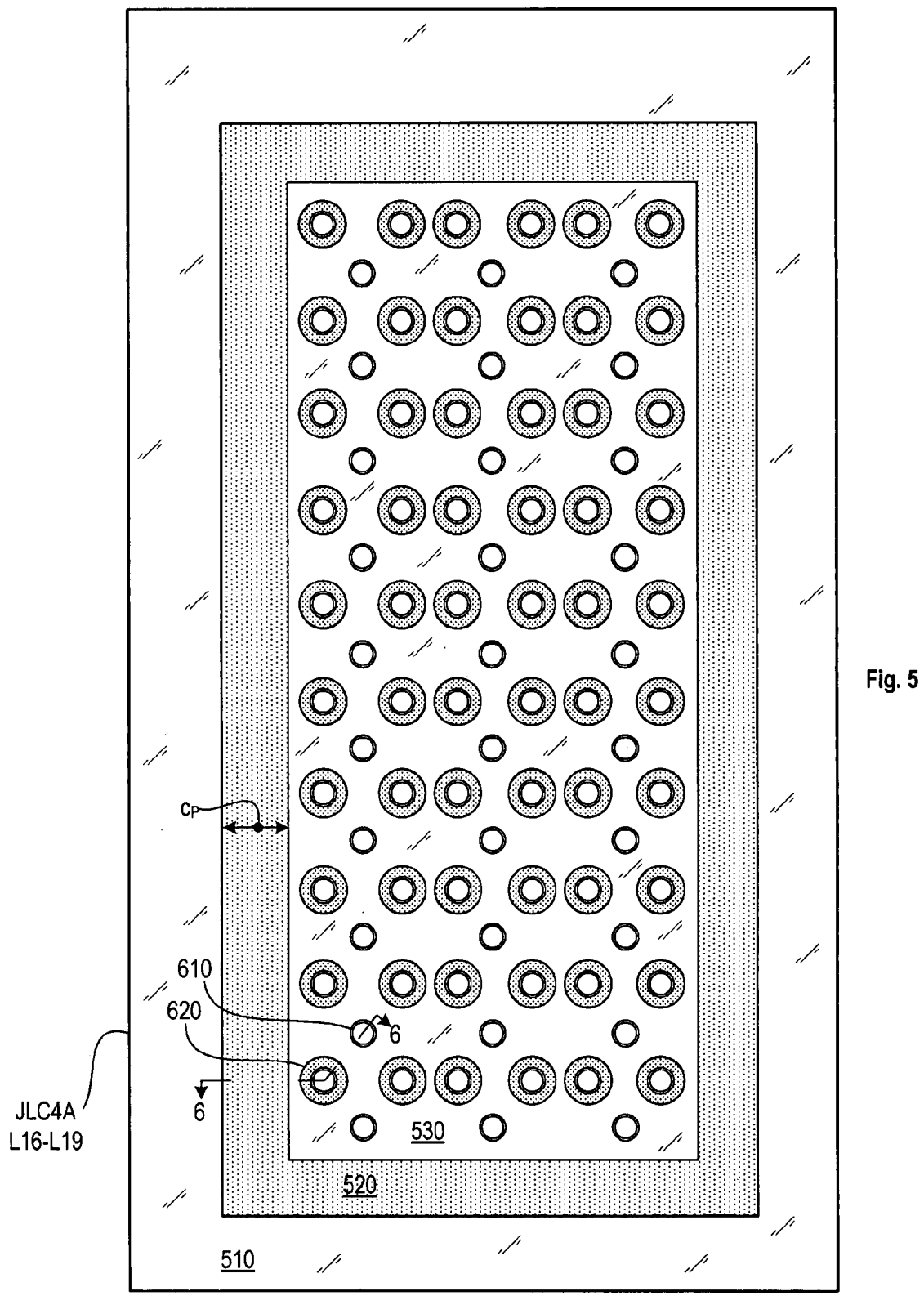
FIG. 5 depicts internal details for a high-speed connector region of an embedded power plane in an embodiment of the present invention.

The preferred embodiments provide a solution to these problems by placing a digital ground section in the power plane layers. Referring to FIG. 5, a revised high-speed connector region JLC4A is illustrated. Instead of a single large clearance occupying essentially the entire connector region, a large metal section 530 is retained in the connector region. Section 530 is isolated from the power delivery section 510 of the metal layer by a dielectric frame 520 of width $C_P$. This arrangement does not substantially change the amount of power plane metal available to carry current to the power connectors (not shown). The arrangement does, however, significantly decrease the fill requirements in the high-speed connector region during booking.

Figure 6:
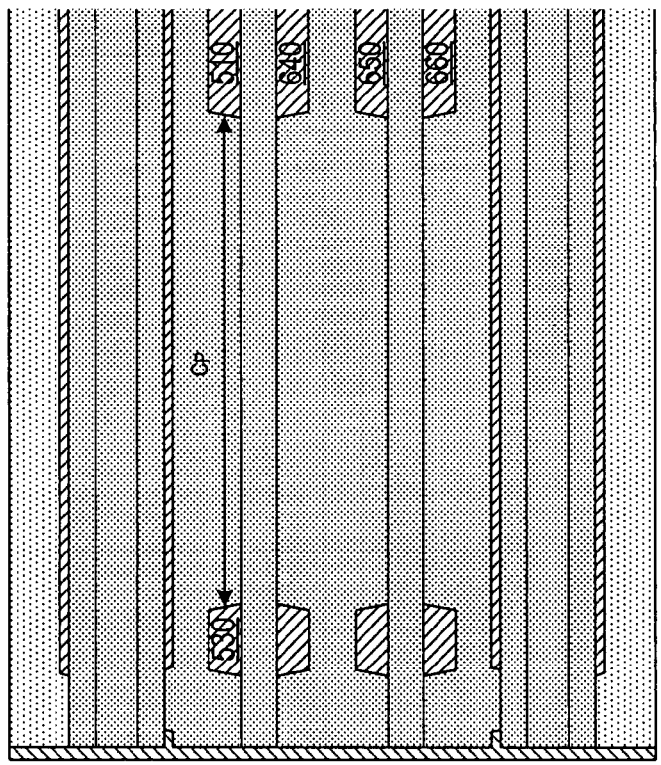
FIG. 6 illustrates the central section of a backplane cross-section, taken through a high-speed throughhole and adjacent features in FIG. 5.
Figure 6:
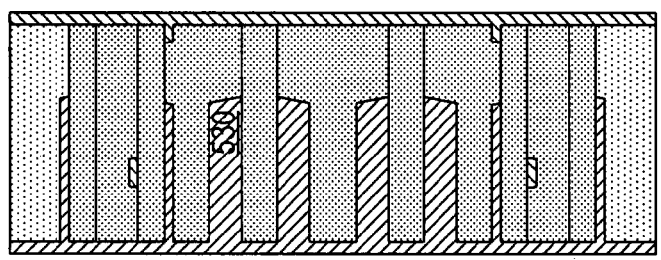
Figure 6:
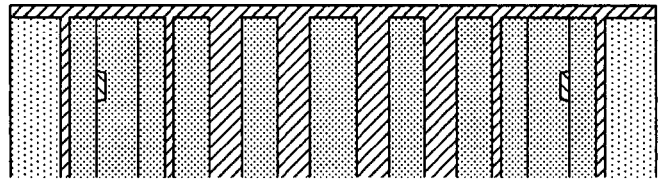

It may be possible in some embodiments to leave metal section 530 floating, but preferably metal section 530 is connected to digital ground. This is accomplished in FIG. 5 by not forming a clearance around the eventual digital ground throughhole (e.g., 610) locations in metal section 530. Referring to the partial cross-section of FIG. 6, it can be seen that when digital ground throughhole 610 is drilled it will pass through metal section 530 and similar metal sections of power plane layers L17-L19. Digital ground throughhole 610 is also drilled through digital ground layers L12, L15, L20, and L23 shown in FIG. 6, as well as other digital ground layers such as shown in FIG. 3. When digital ground throughhole 610 is subsequently plated, it will electrically connect metal section 530 and the corresponding metal sections in layers L17-L19 to the digital ground layers, and ultimately to digital ground.

Where each of the high-speed signal throughholes will pass through metal section 530, a preferably circular clearance is formed, e.g., the clearance shown in FIG. 5 around signal throughhole 620. The diameter of this clearance is preferably set to achieve a similar throughhole impedance as the impedance of other conductive sections of the throughhole. When the power planes are thicker than the digital ground planes, such as in the illustrated embodiments, this may require a larger clearance than that used on the digital ground planes. The optimal clearance diameter can be determined experimentally for a given set of signaling conditions and dielectric. Generally, however, this clearance will be much smaller than the primary power clearance $C_P$, and will thus allow metal section 530 to be formed as a monolithic region.

Besides the fabrication and impedance benefits noted above, it is believed that at least some embodiments of the present invention provide a noise benefit. Adjacent high-speed signaling throughholes are shielded from each other by metal section 530, whereas in the prior construction no such shielding was possible in the power layers of the backplane. Furthermore, metal section 530 is preferably interposed between the power delivery section 510 of the power plane and the high-speed throughholes at the periphery of the high-speed connector region, thus providing additional power-to-signal isolation.

One of ordinary skill in the art will recognize that the concepts taught herein can be tailored to a particular application in many other advantageous ways. The principles described herein are generally applicable to many different dielectric materials. Other adaptations are possible, such as removing some portions of the metal section 530 to allow differential coupling between some neighboring throughholes. Not all digital ground throughholes need connect to metal section 530, and a metal section 530 could be incorporated on some power planes and not others. Although the described embodiments represent one application, less complex backplanes can also benefit from the claimed invention.

Although the specification may refer to "an", "one", "another", or "some" embodiment(s) in several locations, this does not necessarily mean that each such reference is to the same embodiment(s), or that the feature only applies to a single embodiment.

What is claimed is:

1. A modular router comprising:
    at least two line cards to receive and transmit packets external to the router;
    an electrical backplane having slots for each of the line cards, each slot comprising at least one power connector region and at least one high-speed connector region, the power connector region supplying operating power to the line card in that slot from power planes embedded in the backplane, the high-speed connector region providing electrical connections from the line card in that slot to high-speed signaling traces in the backplane, the electrical connections passing through at least one of the power planes through clearances in a conductive plane section that is electrically connected to digital ground and not to a power supply section of that power plane.

2. The modular router of claim 1, each of the power planes having a thickness at least as thick as an equivalent layer of three-ounce copper.

3. The modular router of claim 1, further comprising a plurality of digital ground plane layers, wherein the electrical connection clearances in the first conductive plane section are of a size that allows high-speed signaling to be routed through the power planes with approximately the same impedance as where the high-speed signaling electrical connections pass through the digital ground plane layers.

4. The modular router of claim 1, wherein the conductive plane section completely surrounds each high-speed electrical connection in the high-speed connector region, the conductive plane section separated from each high-speed electrical connection by a respective one of the clearances.

5. A method of fabricating high-speed signal paths in an electrical backplane, the method comprising:
    embedding multiple power planes in the backplane, the multiple power planes having the capability to power components connected to the backplane through at least one power connector region;
    routing a group of high-speed signals through the multiple power planes in a high-speed connector region comprising a plurality of conductive high-speed signaling throughholes and at least one conductive digital ground throughhole;
    for each power plane, forming a clearance between a first conductive plane section in the high-speed connector region and a power supply section of the power plane;
    for each first conductive plane section, forming a clearance between the first conductive plane section and each of the high-speed signaling throughholes in the high-speed connector region; and
    for each first conductive plane section, connecting the conductive plane section to at least one of the digital ground throughholes.

6. The method of claim 5, further comprising setting the clearance between the first conductive plane section and each of the high-speed signaling throughholes such that the impedance of each high-speed signaling throughhole is approximately equal in the power plane region of the backplane as in other layer regions of the backplane.

7. The method of claim 5, further comprising grouping the power planes together between digital ground planes.

8. The method of claim 7, further comprising arranging four power planes to function as a first primary power plane, a first primary power return plane, a second primary power plane, and a second primary power return plane.

9. The method of claim 5, further comprising, for at least one digital ground throughhole connected to the first conductive plane section of a power plane, also connecting that digital ground throughhole to the digital ground planes.

* * * * *